US006883153B2

(12) United States Patent
Jiang et al.

(10) Patent No.: US 6,883,153 B2
(45) Date of Patent: Apr. 19, 2005

(54) MINIMIZATION OF MICROELECTRONIC INTERCONNECT THICKNESS VARIATIONS

(75) Inventors: Lei Jiang, Camas, WA (US); Sadasivan Shankar, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 10/340,534

(22) Filed: Jan. 10, 2003

(65) Prior Publication Data
US 2004/0139419 A1 Jul. 15, 2004

(51) Int. Cl.[7] .............................................. G06F 17/50
(52) U.S. Cl. ................... 716/6; 716/5; 716/19; 716/20
(58) Field of Search ........................... 716/4–6, 19, 20; 438/626, 638, 689–699; 205/80–87, 103; 700/121

(56) References Cited

U.S. PATENT DOCUMENTS

| 5,847,327 | A | | 12/1998 | Fischer et al. |
| 6,214,445 | B1 | | 4/2001 | Kanbe et al. |
| 6,380,078 | B1 | * | 4/2002 | Liu et al. ..................... 438/638 |
| 6,514,853 | B1 | * | 2/2003 | Matsubara .................. 438/626 |
| 6,596,640 | B1 | * | 7/2003 | Fishcer et al. .............. 438/692 |
| 2003/0104690 | A1 | * | 6/2003 | Matsubara .................. 438/626 |
| 2003/0221966 | A1 | * | 12/2003 | Bonkass et al. ............ 205/103 |
| 2003/0229868 | A1 | * | 12/2003 | White et al. ................... 716/5 |
| 2003/0229880 | A1 | * | 12/2003 | White et al. .................. 716/19 |

OTHER PUBLICATIONS

Alcoe, DJ, "HyperBGA (TM): a High Performance, Low Stress, Laminate Ball Grid Array Flip Chip Carrier," Future Fab, 14 pgs., printed Nov. 17, 2002, http://www.future-fab.com/login.asp?s_id=435&d_ID=1174&mode=print.

Robinson, J.S., "Aircraft Materials," Elements Magazine, University of Limerick Publication, Issue 2, pp. 19–20, Sep. 1994, printed Nov. 21, 2002, http://www.ul.ie/~mst/jeremy/abstract/elements_ac.html.

Svinkin, M.R., "Modulus of elasticity and stiffness of composite hammer cushions," VibraConsult, Cleveland, Ohio, USA, 6 pgs., printed Nov. 21, 2002, http://www.vulcanhammer.net/svinkin/modulus_of_elasticity_and_stiffn.htm.

* cited by examiner

Primary Examiner—Vuthe Siek
(74) Attorney, Agent, or Firm—Schwabe, Williamson & Wyatt, P.C.

(57) ABSTRACT

An efficient TCAD tool to analyze the variation of topography and thickness of interconnects and components of integrated circuits introduced by multiple-layer chemical-mechanical planarization (CMP). Contact stress distribution is determined on all scales as a function of topography. A formulation is used relating the pad deformation and therefore stress directly to pattern topography ({d}), and the pad mechanical properties. The 3-dimensional stress and deformation field is described, along with representation of the statistical pad roughness and slurry thickness information. These process conditions are also functions of the surface topography and contact regimes. The stress-topography relationship is represented as $[A]\{P\}=\{d\}$, where $[A]$ is the influence coefficient matrix determined by the contact mechanics, and $\{P\}$ and $\{d\}$ represent local stress and topography on patterns. With given initial topography and slurry rate kinetics, the surface evolution at each time step of CMP can be traced iteratively to obtain post-CMP topography.

18 Claims, 10 Drawing Sheets

MINIMIZATION OF MICROELECTRONIC INTERCONNECT THICKNESS VARIATIONS

FIELD OF THE INVENTION

The present invention relates to microelectronic device manufacturing and, more particularly, to computer aided design and analysis of semiconductor processes.

BACKGROUND OF INVENTION

Good planarity and the minimization of interconnect thickness variation is the advantage provided by chemical-mechanical planarization (CMP). It is well known that post-CMP topography variation is strongly dependent on layout pattern. Inter-layer (ILD) CMP processes can be approximated using linear models empirically where the polish pressure is directly correlated with the contact area and therefore the layout density. Such models can be applied to the insertion of dummy features to achieve minimal pattern density variation and therefore reduced post-CMP topography variation. A typical modeling flow is shown in FIG. 3.

Some models based on the modification to ILD CMP stress model have been applied to shallow trench isolation (STI) polish, as shown in the density-to-topography example in FIG. 1. However, metal CMP and other selective CMP processes (STI, Poly Gate Polish) cannot be described by linear models because of the interaction between physical and chemical effects that span feature and equipment scales. A good example is the dishing and erosion in copper (Cu) that occurs in the CMP process, which is caused by locally mismatched reaction rates between different materials on the substrate surface and the slurry.

No analytical model exists, especially for general, complex design layouts where the efficiency and the memory requirements of the modeling algorithm are essential. Previous modeling based on physical models has been limited to linear models or to two-dimensional simple feature patterns. A linear Preston's equation is not sufficient to model heterogeneous material removal on a pattern substrate. This is especially true when the removal rate as determined by chemistry is simultaneously related to redistribution of slurry particle contact stress due to feature-scale topography changes. Models for feature-scale CMP are needed to capture the dishing and erosion effects, while incorporating the effect of chemical reactivity.

Analytical design tools, methodology and modeling are needed for predicting non-linear CMP process effects that are computationally efficient.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments of the present invention provides an analytical model, methodology, and design tools for the determination of interconnect thickness variation due to chemical-mechanical planarization (CMP), especially useful for a large-scale, complex, and physical design layout. This is accomplished with a technology computer aided design (TCAD) tool that includes equipment and feature-scale modeling with accurate representation of physical and chemical process parameters.

Figure 1A:
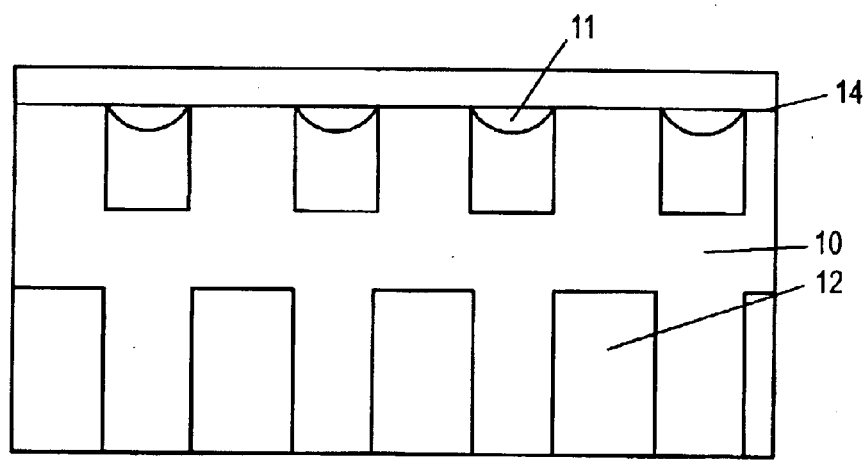
FIGS. 1A, 1B and 1C are top and cross-sectional views, respectively, illustrating representative periodic structure for CMP simulation with heterogeneous materials.
Figure 1B:
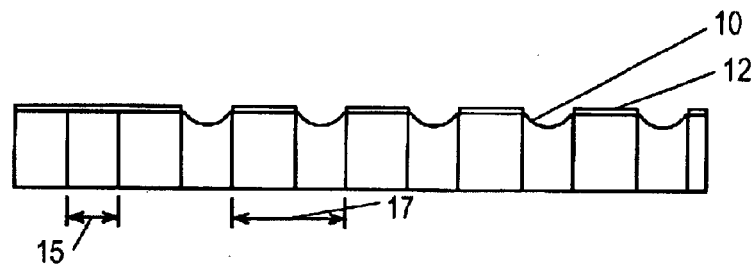
Figure 1C:
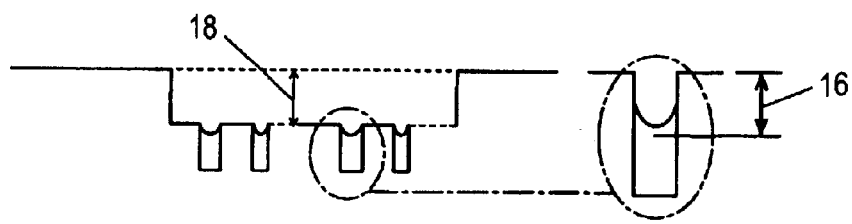

FIGS. 1A, 1B and 1C are top and cross-sectional views, respectively, illustrating representative periodic structure for CMP simulation with heterogeneous materials. FIG. 1A shows the initial topography of a metal layer 10 on top of patterned structures 12, with pad asperity deformation 11. Initially, planarization of incoming topography is determined by the slurry kinetics for the metal layer 10 and stress distribution P(x, y) only, where x and y denote the dimensions within the substrate surface plane 14, and P representing the normal stress. For fixed slurry kinetics, contact stress is a key contributor to the CMP efficiency.

FIGS. 1B and 1C show dishing 16 for a planarized surface with the bulk of the metal layer 10 removed and dielectric material 12 exposed, with linewidth 15 and pitch 17. When dielectric material 12 is exposed, however, the polish rate for the metal 10 and dielectric 12 are different, as determined by kinetics. Therefore, the removal rate at each exposed feature and the stress distribution P(x,y) within the feature are necessary for the accurate description of surface topography evolution F(x,y), and for predicting dishing 16 and erosion 18, among others.

Figure 2:
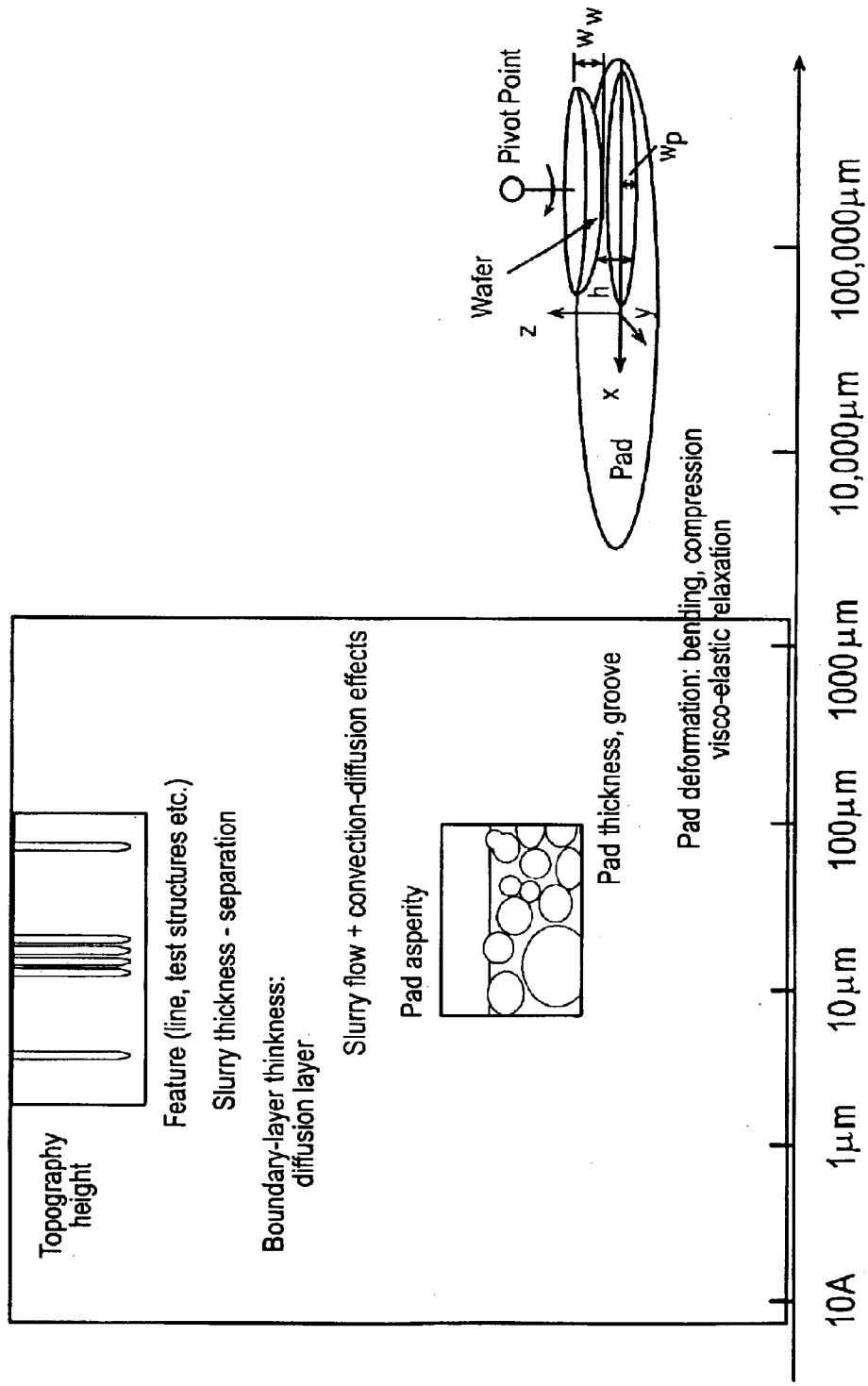
FIG. 2 is an illustration depicting length scales of topography, features, and physical parameters that are important to the determination of interconnect thickness variation due to metal CMP, especially dishing and erosion.

FIG. 2 is an illustration depicting length scales of topography, features, and physical parameters that are important to the determination of interconnect thickness variation due to metal CMP, especially dishing and erosion. The graphic inserts represent electroplated features, pad surface texture, and the pad/substrate relative motion, all plotted on the corresponding length scale. Pad surface roughness, slurry film thickness, and pad deformation length are three stress-related key parameters. An appropriate algorithm for the determination of post-CMP thickness variation needs to capture all these physical effects on the feature-scale topography evolution. Such a model needs linked to the chemistry kinetics and linked to substrate-scale effects.

Figure 3:
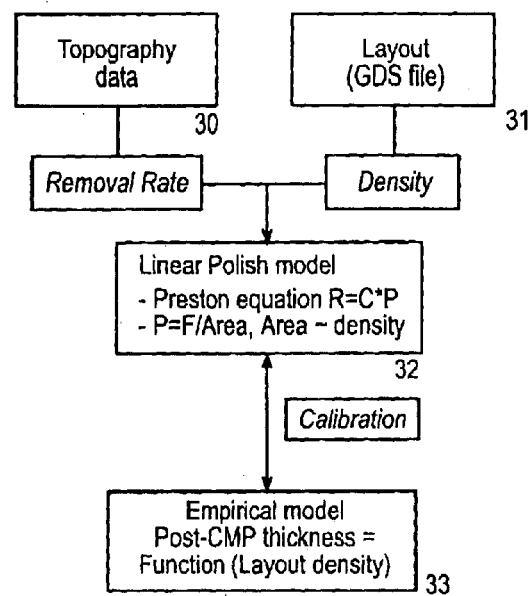
FIG. 3 presents a flow chart of a predictive tool, currently used in the art, using a linear polish model, Preston's equation, and empirical calibration that relates post-CMP topography to layout density.

FIG. 3 presents a flow chart of a predictive tool, currently used in the art, using a linear polish model, Preston's equation, and empirical calibration that relates post-CMP topography to layout density. The model uses topography data 30 and layout data 31 as input to the linear polish model 32 to predict post-CMP topology. The results of the model are calibrated with post-CMP measurements to adjust the linear model creating an empirical predictive model 33.

Figure 4:
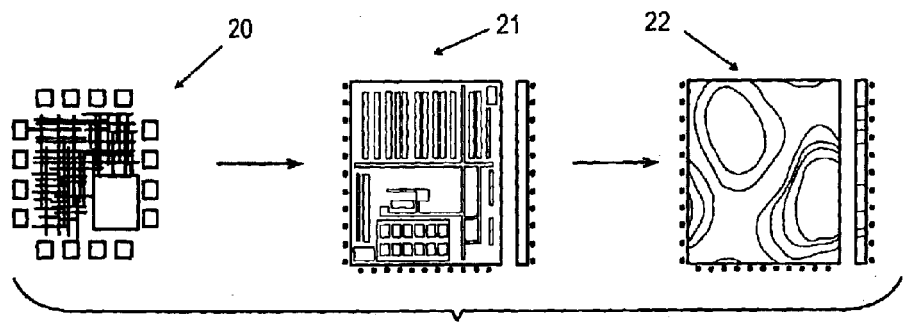
FIG. 4 illustrates how the circuit layout and the circuit density results in the calculation of post-CMP topography based on the predictive tool of FIG. 3.

FIG. 4 illustrates how the circuit layout 20 and the circuit density 21 results in the calculation of post-CMP topography 22 based on the predictive tool of FIG. 3. The linear model is not sufficient to model heterogeneous material removal, and therefore relies on empirical data to adjust the model as a substitute for non-linear modeling required for complex interaction between the topography and CMP process.

In an embodiment of the TCAD analytical tool to analyze and minimize the variation (topography and thickness) of interconnects and components in integrated circuit introduced by manufacturing process and integration, multiple layer CMP, and methodology for a large-scale, general mask/layout, in accordance with the invention, the method comprises:

implementing physical and chemical methods to the feature scale and extracting a matrix representing parameters directly associated with the components in the system, such as, but not limited to, metallized interconnect lines in found in integrated circuit design, and represents the physical properties associated with loading, whether chemical or mechanical, in the manufacturing process, such as but not limited thereto, chemical mechanical planarization (CMP);

analyzing interconnect characteristics and variations due to process such as CMP;

implementing, using fast solvers specifically designed for dense matrices, an algorithm based on integral-equation formulation;

extending the algorithm to large scale layouts, where N is the size of the discretized layout, the algorithm efficiency of the TCAD scaling with $O(N^2)$ or $O(N \log N)$, where N is the size of the discretized layout;

modeling and optimizing the performance of the CMP process, including CMP pad, slurry and other process conditions, extending to general interconnect layouts with multiple-step processes, the extracted influence matrix;

extending to the minimization of interconnect thickness variation of similar chemical and mechanical processes by modifying microelectronic device layout, including, but not limited to, spacing, linewidth, and global density.

Embodiments in accordance with the present invention comprise an efficient TCAD tool to analyze and minimize the variation, such as, but not limited to, topography and thickness, of interconnects and components of integrated circuits introduced by manufacturing process and integration, such as with multiple-layer CMP, and methodology for a large-scale, general mask/layout. The TCAD tool provides methodology using a fast and efficient algorithm to determine the contact stress distribution on all scales as a function of topography. Instead of the algebraic equation that is used in linear models for ILD CMP to relate pressure with topography, an embodiment in accordance with the present invention uses a formulation relating the pad deformation and therefore stress directly to pattern topography ({d}), and the pad mechanical properties. This formulation describes the 3-dimensional stress and deformation field along with the accurate representation of the statistical pad roughness and slurry thickness information. These process conditions are also functions of the surface topography and contact regimes. In one embodiment in accordance with the present invention, the stress-topography relationship is represented into the following form $$[A]\{P\}=\{d\}$$

where [A] is the influence coefficient matrix determined by the contact mechanics, and {P} and {d} represent local stress and topography on patterns. With given initial topography and slurry rate kinetics, the surface evolution at each time step of CMP can be traced iteratively to obtain post-CMP topography. The general solution of these systems is, however, computationally intensive, often scaled with $N^3$, where N represents the total number of simulation grids.

Figure 6:
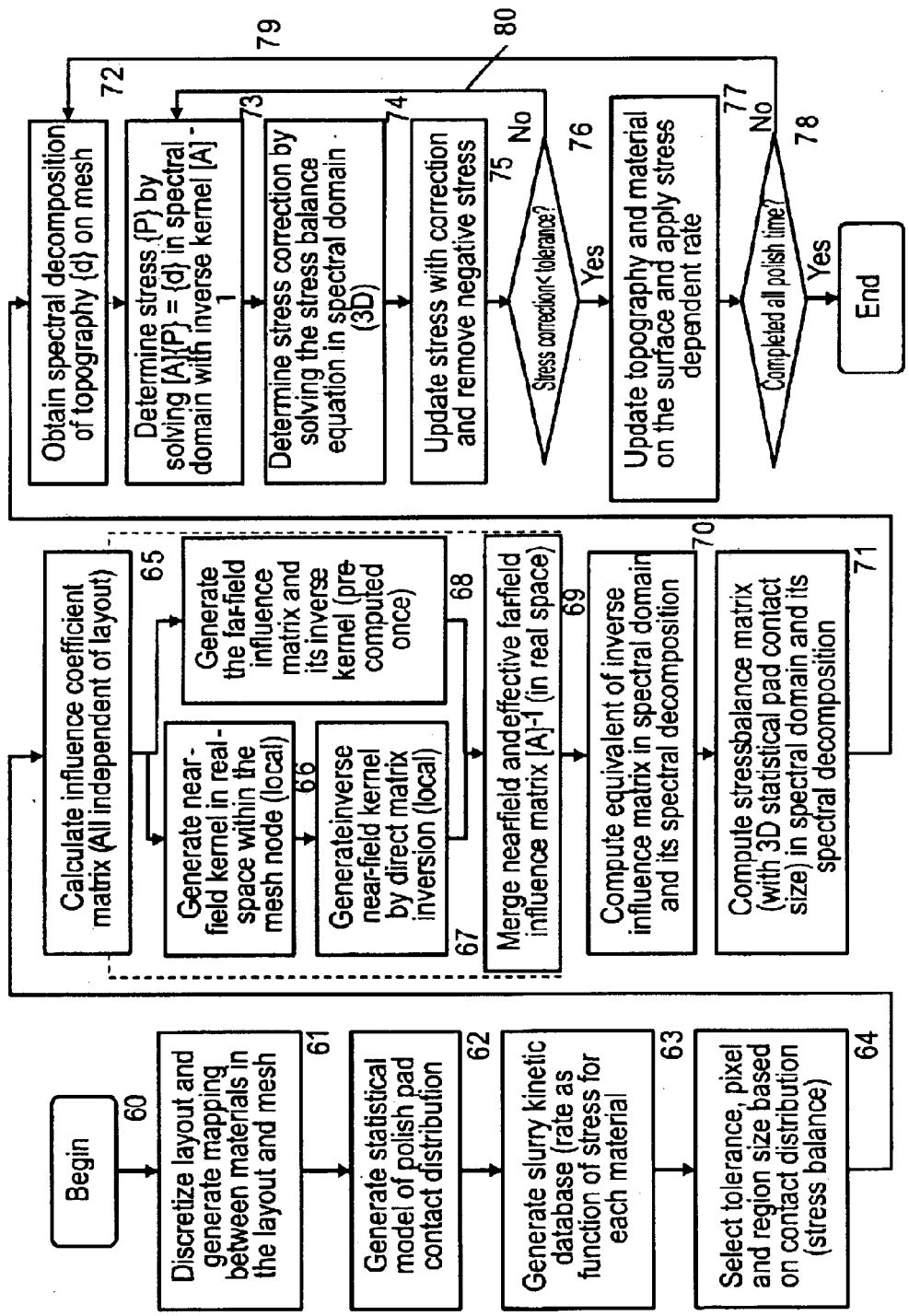
FIG. 6 is a flow chart that expands on the embodiment of FIG. 5 of a generalized methodology and its implementation in a TCAD tool, in accordance with the present invention.

Details of the implementation, including the stress-topography algorithm, is further described in FIG. 6, including fast assembly for the coefficient matrix, fast iterative, spectral technique, and statistical roughness implementation. The methodology includes:

the influence matrix is divided into near-field and far-field components, with the near-field influence calculated on a local region with a fixed number of mesh points independent of problem size N. The far-field influence, based on the distance between two regions, can be described by analytical solution or by a numerical approximation that can be calculated once, again independent of N and layout. The matrix [A] can be pre-computed before the topography evolution, and its inversion done only selectively;

a spectral transformation is done on both the topography and the stress distribution such that the equation can be solved in the spectral space efficiently; and the stress balance, on the pad roughness scale, can be implemented in the spectral space as a stress correction with the spectral representation of roughness distribution.

Figure 5:
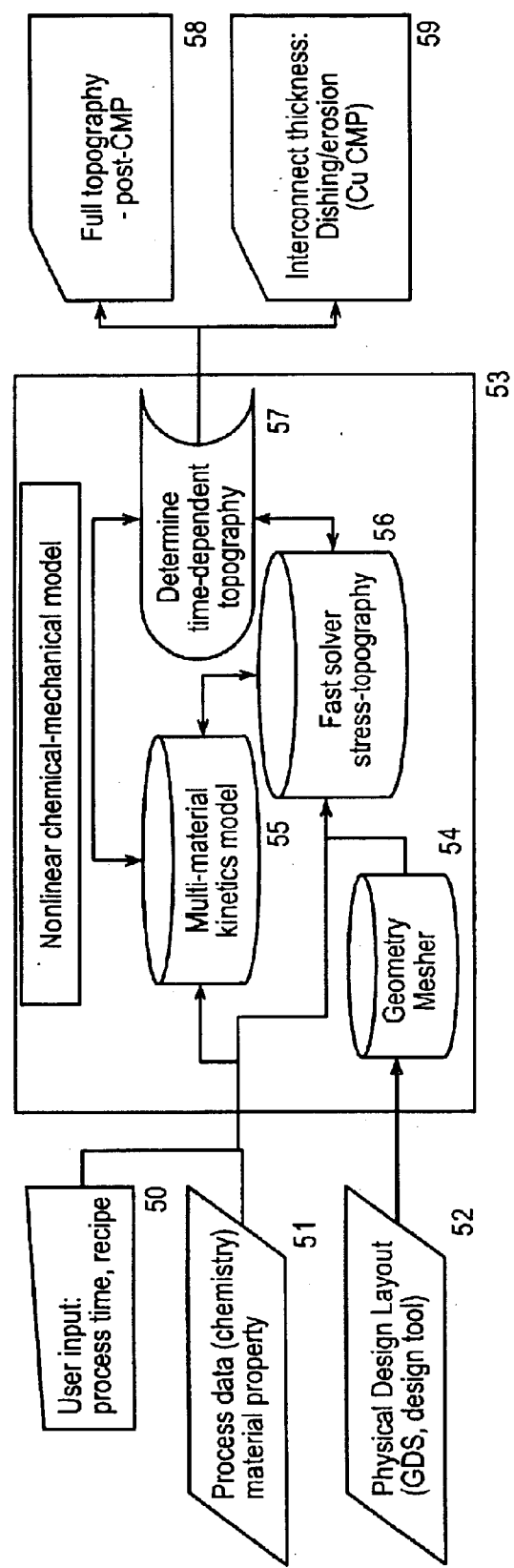
FIG. 5 is a flow diagram of an embodiment in accordance with methods of the present invention, providing a TCAD tool for the determination of topography and thickness variation due to CMP.

FIG. 5 is a flow diagram of an embodiment in accordance with methods of the present invention, providing a TCAD tool for the determination of topography and thickness variation due to CMP. The methodology couples nonlinear modeling for pad-substrate contact stress over multiple length scales and chemistry kinetics to predict topography evolution during a multi-step CMP process. The model comprises: inputting the proposed CMP process 50, inputting the chemical and material data 51; inputting the design layout 52; processing the data using nonlinear chemical-mechanical process model 53 by discretizing the design layout using a geometry mesher 54, using a multi-material kinetics model 55, using data from a fast stress-topography solver 56 to predict the time-dependent topography which is used to calculate the next time step or to output 57; outputting predicted post-CMP topography 58, including data for dishing and erosion which effects the interconnect thickness 59.

The TCAD tool is used to determine post-CMP topography, including dishing and erosion for Cu CMP in particular, that encompasses the nonlinear chemical-mechanical interaction, process conditions, chemistry, and detailed layout structure, not just layout density used in the linear models. Components represented by shaded blocks 54, 56, 57 are key elements that can be used for the determination of interconnect variation due to other back-end processes.

FIG. 6 is a flow chart that expands on the embodiment of FIG. 5 of a generalized methodology and its implementation in a TCAD tool, in accordance with the present invention. The model comprises: beginning by inputting the proposed CMP process, chemicals and material data, and design layout 60; discretizing the layout to generate mapping between the materials in the layout and the mesh representing the layout 61; generating statistical model of the polish pad contact distribution 62; generating the slurry kinetic database, including the rate as a function of stress for each material 63; selecting a tolerance, pixel and region size based on contact distribution, including the stress balance 64; calculation the influence coefficient matrix 65 based on both near-field and far-field influence, the near-field by generating near-field kernel in real-space within each mesh node 66 and generating inverse near-field kernel by direct matrix inversion, and far-field by generating the far-field influence matrix and its inverse kernel 68; merging the near-field and effective far-field influence matrix in real space 69; computing the equivalent of inverse influence matrix in spectral domain and its spectral decomposition 70; computing the stress-balance matrix, with 3-dimensional statistical pad contact size, in spectral domain and its spectral decomposition 71; obtaining spectral decomposition of topography on the mesh; determining stress by solving $[A]\{P\}=\{d\}$ in spectral domain with inverse kernel $[A]^-$ 73; determining the stress correction by solving the stress balance equation in the spectral domain 74; updating the stress with correction and remove negative stress 75; determine if stress correction is less than the tolerance 76, if no, re-iterate stress determination 80, if yes, updating topography and material on the surface and apply stress-dependent rate 77, determining if all polish time has been calculated 78, if no, re-iterate on the spectral decomposition of topography 79, if yes, output data.

Figures 7A, 7B:
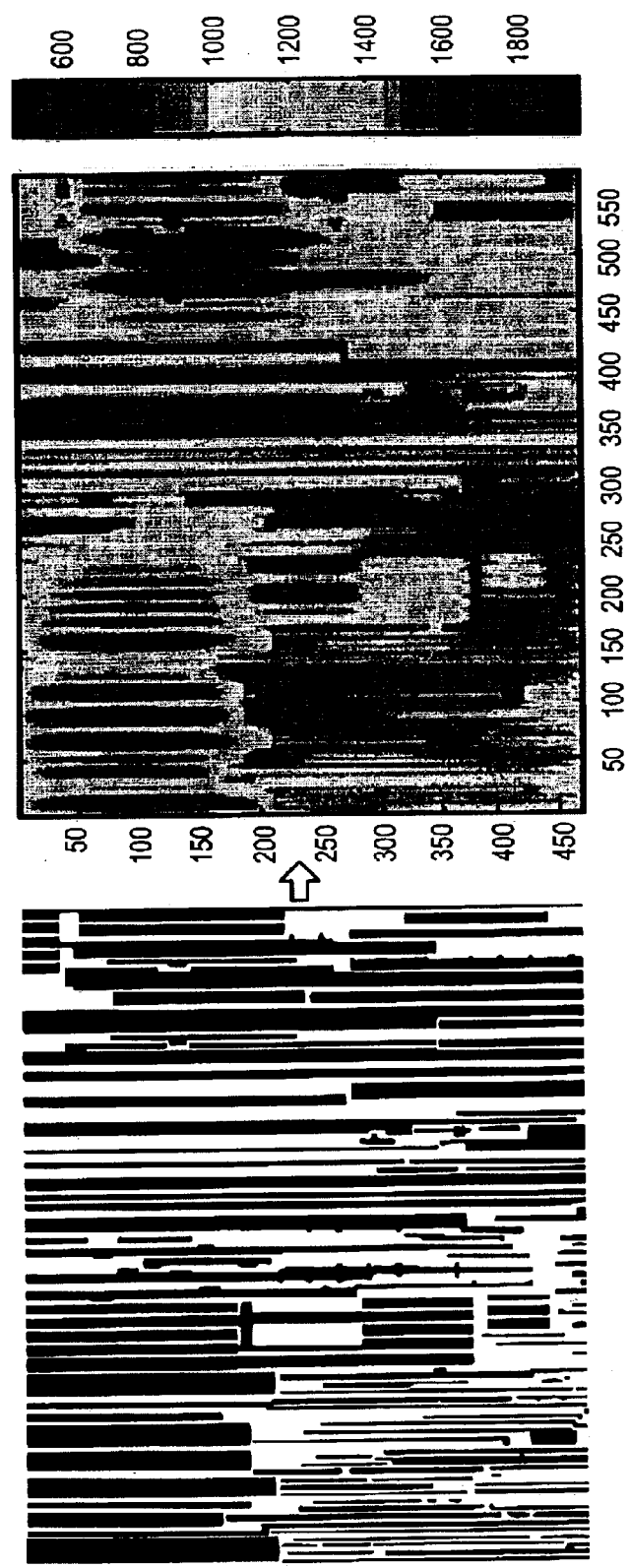
FIGS. 7A and 7B illustrate an example of the implementation of the embodiment of FIG. 6, with FIG. 7A showing layout pattern, and FIG. 7B showing the post-Cu CMP topography.

FIGS. 7A and 7B illustrate an example of the implementation of the embodiment of FIG. 6, with FIG. 7A showing layout pattern, and FIG. 7B showing the post-Cu CMP topography. Both dishing in the lines and erosion in structures are clearly illustrated.

Figure 8A:
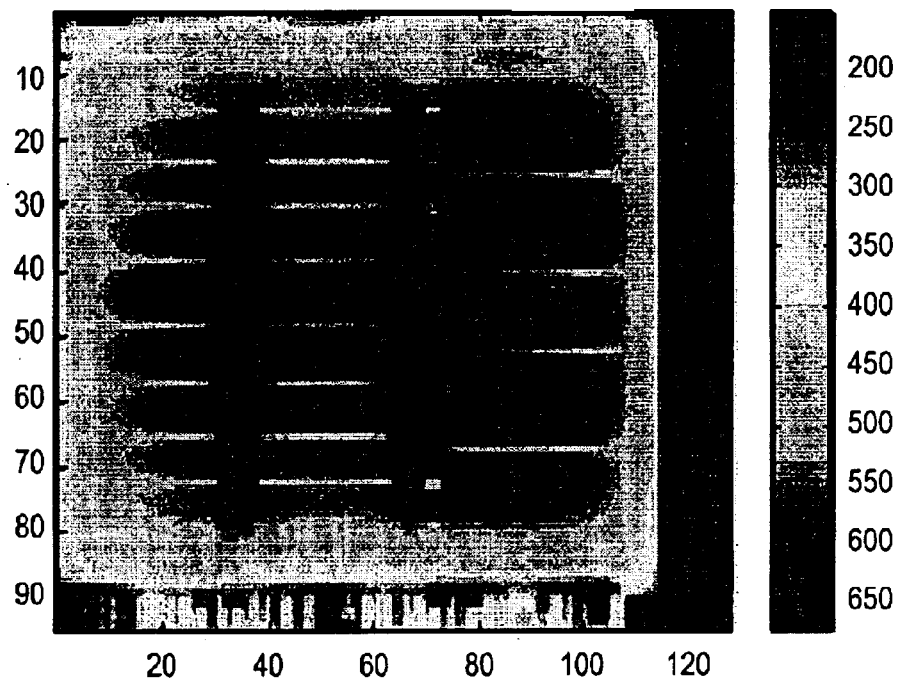
FIGS. 8A–C illustrate another example of the implementation of the embodiment of FIGS. 5 and 6.
Figure 8B:
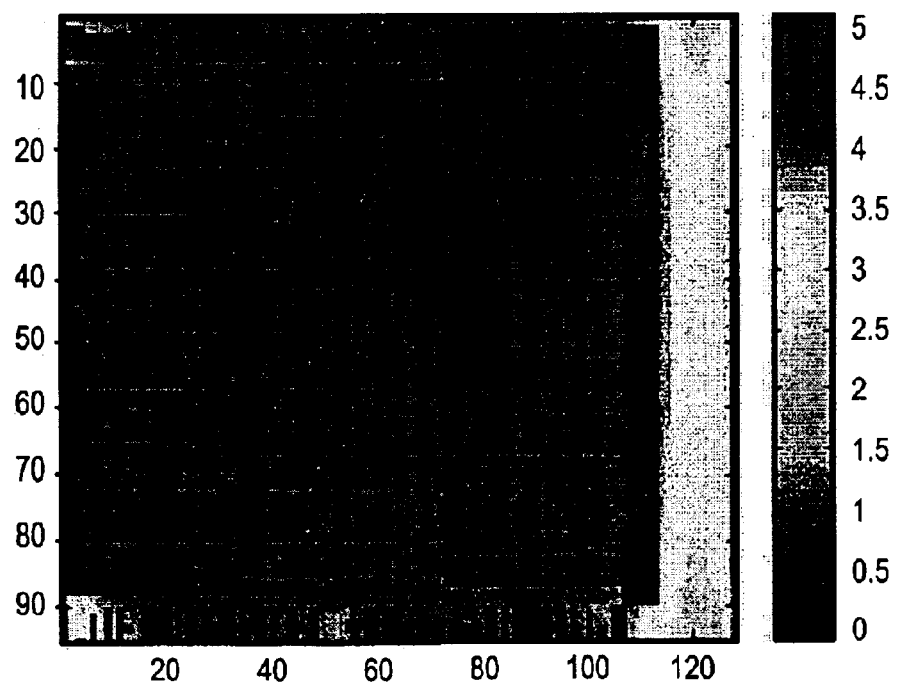
Figure 8C:
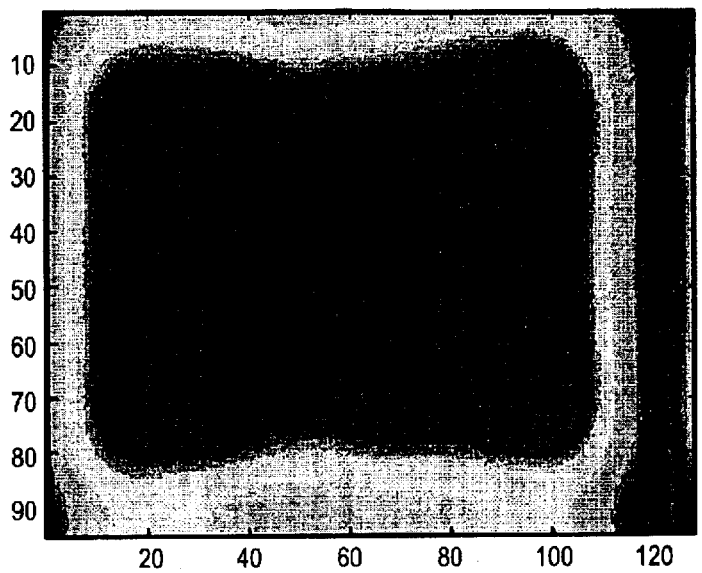

FIGS. 8A–C illustrate another example of the implementation of the embodiment of FIGS. 5 and 6, of the predicted topography on a small layout, shown in FIG. 8A, stress contour solved by the near-field and far-field influence matrix, shown in FIG. 8B, and stress correction as determined by the overall stress balance, shown in FIG. 8C, during the iteration of one time step.

Figure 9B:
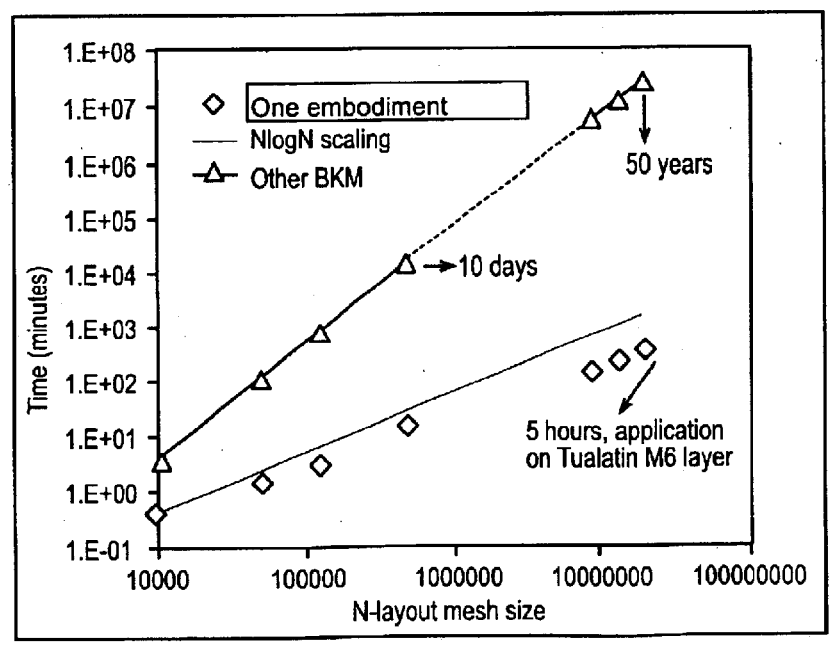
FIG. 9B provides a graph of time efficiency scaling compared to best known predictive methods without the fast algorithm described in accordance with an embodiment of the present invention.
Figure 9A:
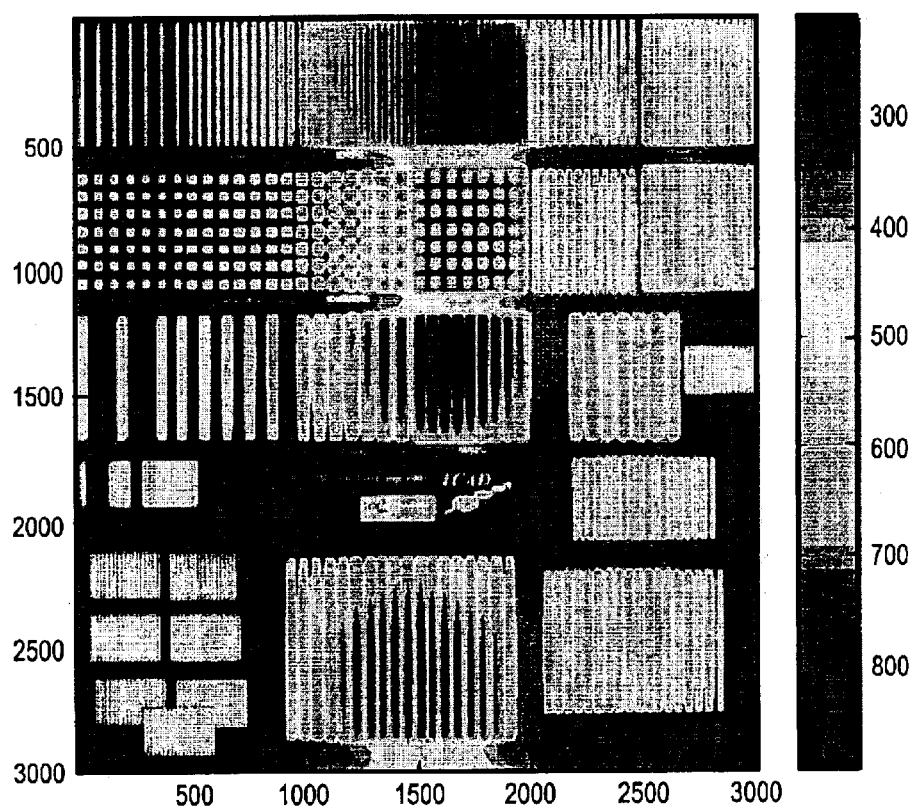
FIG. 9A is a simulation of a 150 um×150 um layout designed for benchmark of the methodology and its performance in accordance with an embodiment of the present invention.

FIG. 9A is a simulation of a 150 um×150 um layout designed for benchmark of the methodology and its performance. With a resolution of 0.05 um resolution (3000×3000 grid), the dishing within features and erosion of the high density structure regions are clearly illustrated as negative value representing topography below the original trench top reference.

FIG. 9B provides a graph of time efficiency scaling compared to best known predictive methods without the fast algorithm described in accordance with an embodiment of the present invention. Such a simulation would be difficult to complete within 24 hours without the fast algorithm provided in accordance with the present invention. However, a typical simulation of such size can be completed on a 700 MHz desktop computer system within 1–2 hours with the fast algorithm provided in accordance with the present invention.

Figure 10A:
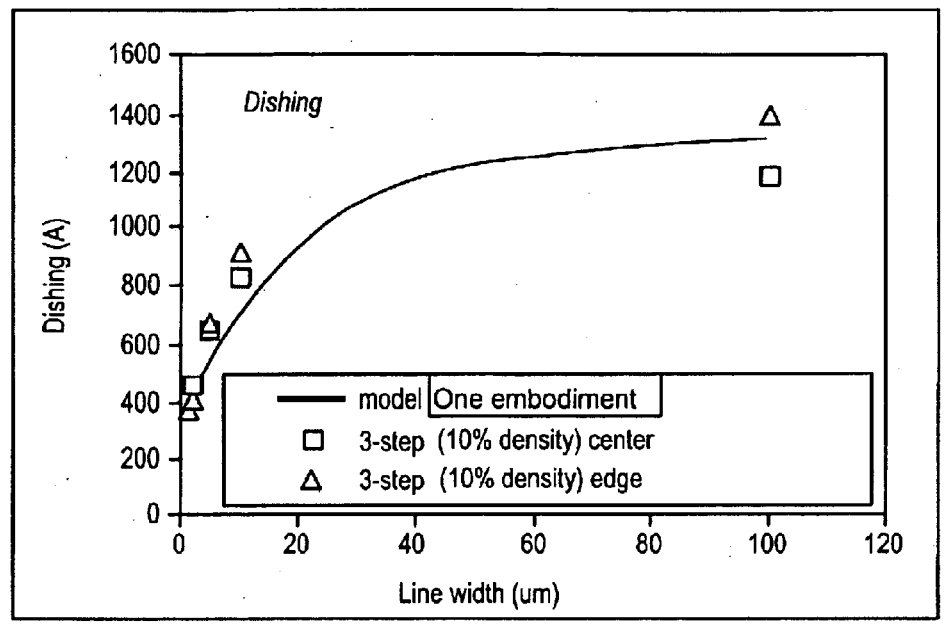
FIGS. 10A and 10B are graphs of predicted dishing and erosion data, respectively, using the tool in accordance with the present invention.
Figure 10B:
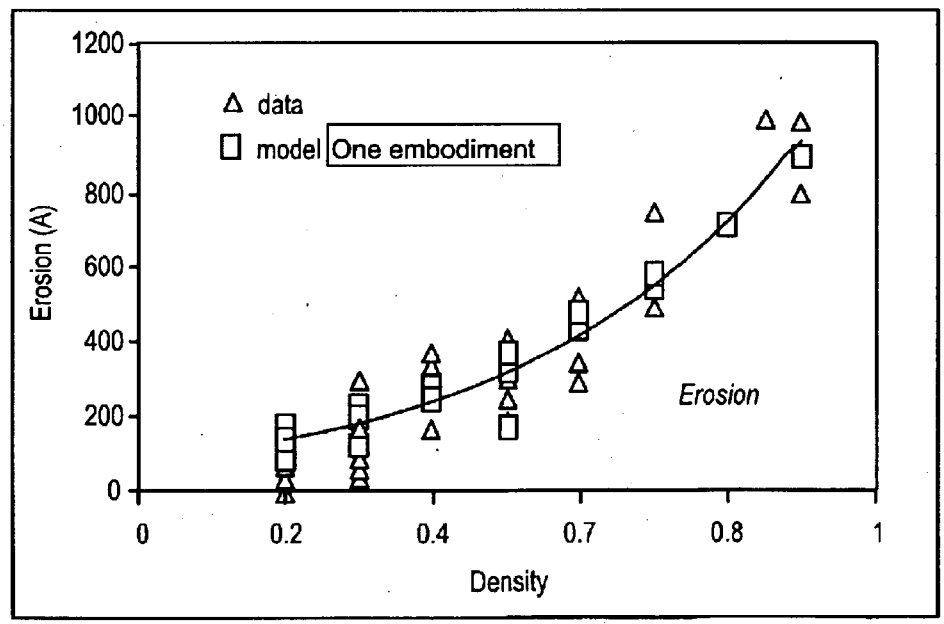

FIGS. 10A and 10B are graphs of predicted dishing and erosion data, respectively, using the tool in accordance with the present invention. The results are demonstrated accuracy of such the tools in accordance with the preset invention, which is compared with P860 data on both 1×31 and 1×39 test chips. The dishing prediction is well within the substrate-scale (center to edge) variation, and clearly demonstrates the dependence on linewidth. The erosion is a function of local pattern density and also shows good agreement between data over a wide range of the density variation.

The TCAD tool, in accordance with the embodiment of FIGS. 5 and 6, combines the near-field/far-field approximation of the influence matrix with statistical pad roughness, the spectral technique, multi-material chemistry, and topography evolution. A demonstrated efficiency improvement to $N \log(N)$ to $N^2$ with these techniques is proven. Results of the tool indicate the efficiency and effectiveness of the overall methodology.

The algorithm, in accordance with the invention, as part of the TCAD tool described above in FIGS. 5,6, is extended to multilevel simulations to model both local layout pattern effect on mm-scale and on substrate scale, coupled with existing EDA tools for layout and design rule analysis, as well as design for manufacturability tools.

The TCAD tool provided in accordance with the present invention provide a full CMP model tool and generalized analysis capability for variations due to processes such as CMP for a complex design layout. The approach bridges physical CMP models on the feature-level and CMP process, including environment, consumables and process conditions. The tool is extendable to multiple CMP steps, such as, but not limited to, Cu slurry and Ta slurry, and multiple back-end simulation steps for integration flow analysis, including multi-layer CMP. The tool is applicable to multi-level simulation and also to analysis that leverages the design hierarchy in the layout, applicable to both unit-cell layout and to general large-scale layout, among others. The efficient algorithm implemented as part of the TCAD tool is extendable to large-scale layout-coupled process optimization and layout optimization.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. In a processing system, a method comprising:
   calculating an influence coefficient matrix of a chemical and mechanical planarization process in real space using a statistical polish pad model and slurry kinetics;
   obtaining a pad stress in a spectral domain using the influence coefficient matrix in real space and an existing topography; and predicting a time-dependent topography change rate of the chemical and mechanical planarization process by iteratively applying a time-dependent topography change rate until the pad stress in the spectral domain and a pad stress in real space converge.

2. The method of claim 1, further comprising:
predicting a time-dependent topography based on the time-dependent topography change rate.

3. The method of claim 2, wherein predicting the time-dependent topography comprises:
applying the predicted time-dependent topography change rate to the existing topography;
recalculating the time-dependent topography change rate if an additional layout remains to be processed; and
obtaining the predicted time-dependent topography when no additional layouts remain to be processed.

4. The method of claim 1, wherein calculating an influence coefficient matrix of a chemical and mechanical planarization process in real space comprises:
generating a near-field influence coefficient kernel in real space;
generating a far-field influence coefficient kernel in real space; and
calculating the influence coefficient matrix by merging the near-field and the far-field influence kernel.

5. The method of claim 1, wherein obtaining a pad stress in a spectral domain comprises:
calculating an influence coefficient matrix in spectral domain using the influence coefficient matrix in real space and the existing topography; and
computing the pad stress in the spectral domain using the influence coefficient matrix in the spectral domain.

6. The method of claim 1, further comprising:
determining a stress correction in the spectral domain by balancing the pad stress with a pad stress in real space;
recalculating the pad stress in spectral domain if the stress correction is greater than a tolerance; and
updating the pad stress in the spectral domain with the stress correction to obtain the time-dependent topography change rate when the stress correction is less than the tolerance.

7. A processing system, comprising:
a storage device having a plurality of instructions stored thereon, the instructions, which when executed, operate to
calculate an influence coefficient matrix of a chemical and mechanical planarization process in real space using a statistical polish pad model and slurry kinetics;
obtain a pad stress in a spectral domain using the influence coefficient matrix in real space and an existing topography; and
predict a time-dependent topography change rate of the chemical and mechanical planarization process by iteratively applying a time-dependent topography change rate until the pad stress in the spectral domain and a pad stress in real space converge;
a processor coupled to the storage device to execute the instructions; and
an output device coupled to the processor and adapted to output the predicted time-dependent topography change rate.

8. The system of claim 7, the storage device further comprises instructions thereon, the instructions, which when executed, operate to:

predict a time-dependent topography based on the time-dependent topography change rate.

9. The system of claim 8, wherein the instructions to predict the time-dependent topography further comprises instructions, which when executed, operate to:
apply the predicted time-dependent topography change rate to the existing topography;
recalculate the time-dependent topography change rate if an additional layout remains to be processed; and
obtain the predicted time-dependent topography when no additional layouts remain to be processed.

10. The system of claim 7, wherein the instructions to calculate an influence coefficient matrix of a chemical and mechanical planarization process in real space further comprises instructions, which when executed, operate to:
generate a near-field influence coefficient kernel in real space;
generate a far-field influence coefficient kernel in real space; and
calculate the influence coefficient matrix by merging the near-field and the far-field influence kernel.

11. The system of claim 7, wherein the instructions to obtain a pad stress in spectral domain further comprises instructions, which when executed, operate to:
calculate an influence coefficient matrix in spectral domain using the influence coefficient matrix in real space and the existing topography; and
compute the pad stress in the spectral domain using the influence coefficient matrix in the spectral domain.

12. The system of claim 7, wherein the plurality of instructions further comprises instructions, which when executed, operate to:
determine a stress correction in the spectral domain by balancing the pad stress with a pad stress in real space;
recalculate the pad stress in spectral domain if the stress correction is greater than a tolerance; and
update the pad stress in the spectral domain with the stress correction to obtain the time-dependent topography change rate when the stress correction is less than the tolerance.

13. A storage medium comprising a plurality of instructions, which when executed, operate to
calculate an influence coefficient matrix of a chemical and mechanical planarization process in real space using a statistical polish pad model and slurry kinetics;
obtain a pad stress in a spectral domain using the influence coefficient matrix in real space and an existing topography; and
predict a time-dependent topography change rate of the chemical and mechanical planarization process by iteratively applying a time-dependent topography change rate until the pad stress in the spectral domain and a pad stress in real space converge.

14. The storage medium of claim 13, further comprising a plurality of instructions, which when executed, operate to
predict a time-dependent topography based on the time-dependent topography change rate.

15. The storage medium of claim 14, wherein the plurality of instructions to predict the time-dependent topography further comprise instructions, which when executed, operate to:
apply the predicted time-dependent topography change rate to the existing topography;
recalculate the time-dependent topography change rate if an additional layout remains to be processed; and obtain the predicted time-dependent topography when no additional layouts remain to be processed.

16. The storage medium of claim 13, the plurality of instructions to calculate an influence coefficient matrix of a chemical and mechanical planarization process in real space further comprises instructions, which when executed, operate to:

generate a near-field influence coefficient kernel in real space;

generate a far-field influence coefficient kernel in real space; and calculate the influence coefficient matrix by merging the near-field and the far-field influence kernel.

17. The storage medium of claim 13, wherein the plurality of instructions to obtain a pad stress in spectral domain further comprises instructions, which when executed, operate to:

calculate an influence coefficient matrix in spectral domain using the influence coefficient matrix in real space and the existing topography; and compute the pad stress in the spectral domain using the influence coefficient matrix in the spectral domain.

18. The storage medium of claim 13, further comprises instructions, which when executed, operate to:

determine a stress correction in the spectral domain by balancing the pad stress with a pad stress in real space;

recalculate the pad stress in spectral domain if the stress correction is greater than a tolerance; and update the pad stress in the spectral domain with the stress correction to obtain the time-dependent topography change rate when the stress correction is less than the tolerance.

* * * * *